(12) United States Patent
Terzioglu et al.

(10) Patent No.: US 8,811,109 B2
(45) Date of Patent: Aug. 19, 2014

(54) MEMORY PRE-DECODER CIRCUITS EMPLOYING PULSE LATCH(ES) FOR REDUCING MEMORY ACCESS TIMES, AND RELATED SYSTEMS AND METHODS

(75) Inventors: Esin Terzioglu, San Diego, CA (US); Changho Jung, San Diego, CA (US); Shahzad Nazar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/463,873

(22) Filed: May 4, 2012

(65) Prior Publication Data
US 2013/0223176 A1 Aug. 29, 2013

Related U.S. Application Data

(60) Provisional application No. 61/603,480, filed on Feb. 27, 2012.

(51) Int. Cl.
*G11C 8/00* (2006.01)

(52) U.S. Cl.
USPC ............ 365/230.06; 365/189.06; 365/189.11; 365/189.12; 365/233.12

(58) Field of Classification Search
USPC ............. 365/189.05, 189.08, 189.09, 189.11, 365/189.12, 194, 230.06, 230.08, 233.11, 365/233.12
See application file for complete search history.

(56) References Cited

U.S. PATENT DOCUMENTS

| | | | |
|---|---|---|---|
| 5,822,252 A | 10/1998 | Lee et al. | |
| 6,026,036 A | 2/2000 | Sekiya et al. | |
| 6,181,635 B1 | 1/2001 | Bae | |
| 2004/0264282 A1* | 12/2004 | Penney | 365/230.06 |
| 2011/0317499 A1* | 12/2011 | Bunce et al. | 365/189.11 |
| 2013/0223178 A1 | 8/2013 | Terzioglu et al. | |

OTHER PUBLICATIONS

International Search Report and Written Opinion—PCT/US2013/027723—ISA/EPO—Jun. 13, 2013.

* cited by examiner

*Primary Examiner* — Son Dinh
*Assistant Examiner* — Hien Nguyen
(74) *Attorney, Agent, or Firm* — Sam Talpalatsky; Nicholas J. Pauley; Joseph Agusta (57) ABSTRACT

Memory pre-decoder circuits employing pulse latch(es) for reducing memory access times, and related systems and methods are disclosed. In one embodiment, the memory pre-decoder circuit includes a memory pre-decoder configured to pre-decode a memory address input within a memory pre-decode setup path to generate a pre-decoded memory address input. Additionally, a pulse latch is provided in the memory pre-decoder circuit outside of the memory pre-decode setup path. The pulse latch samples the pre-decoded memory address input based on a clock signal and generates a pre-decoded memory address output. As such, the memory pre-decode setup path sets up the pre-decoded memory address input prior to the clock signal for the pulse latch. In this manner, the pulse latch is configured to generate a pre-decoded memory address output without increasing setup times in the memory pre-decode setup path.

26 Claims, 7 Drawing Sheets

MEMORY PRE-DECODER CIRCUITS EMPLOYING PULSE LATCH(ES) FOR REDUCING MEMORY ACCESS TIMES, AND RELATED SYSTEMS AND METHODS

PRIORITY APPLICATION

The present application claims priority to U.S. Provisional Patent Application Ser. No. 61/603,480 filed on Feb. 27, 2012 and entitled "PULSED LATCH-BASED MEMORY PRE-DECODING CIRCUITS FOR MEMORY, AND RELATED SYSTEMS AND METHODS", which is hereby incorporated herein by reference in its entirety.

BACKGROUND

I. Field of the Disclosure

The technology of the disclosure relates generally to memory systems and memory pre-decoder circuits.

II. Background

Memory pre-decoder circuits are employed to pre-decode portions of memory addresses prior to final decoding by a decoder. For example, a memory pre-decoder circuit may pre-decode a portion of a memory address that identifies a row of memory cells in memory. The pre-decoded portion of the memory address can be provided to a corresponding row decoder. The row decoder selects the row in memory based on the pre-decoded portion of the memory address from the memory pre-decoder circuit.

Figure 1A:
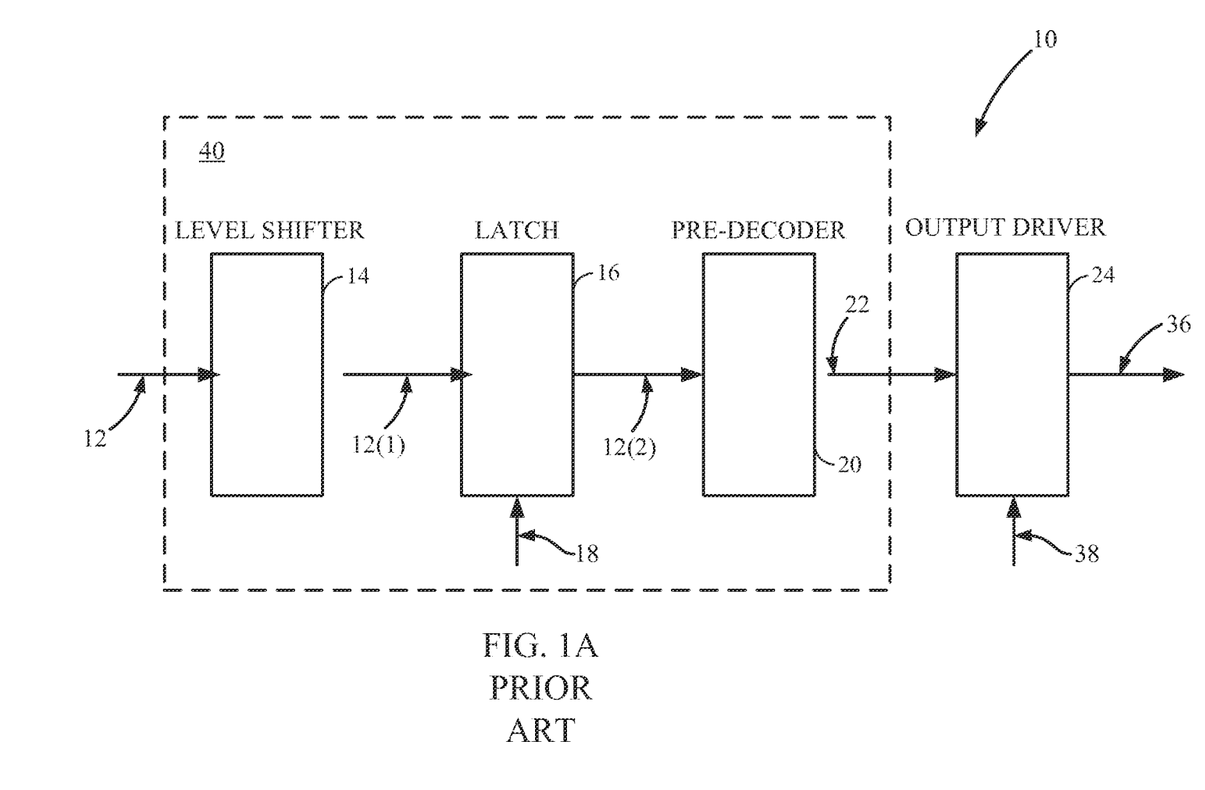
FIG. 1A is a block diagram of an exemplary memory pre-decoder circuit that includes a memory pre-decode setup path and an output driver wherein the memory pre-decode setup path has a voltage level shifter, a latch, and a pre-decoder.
Figure 1B:
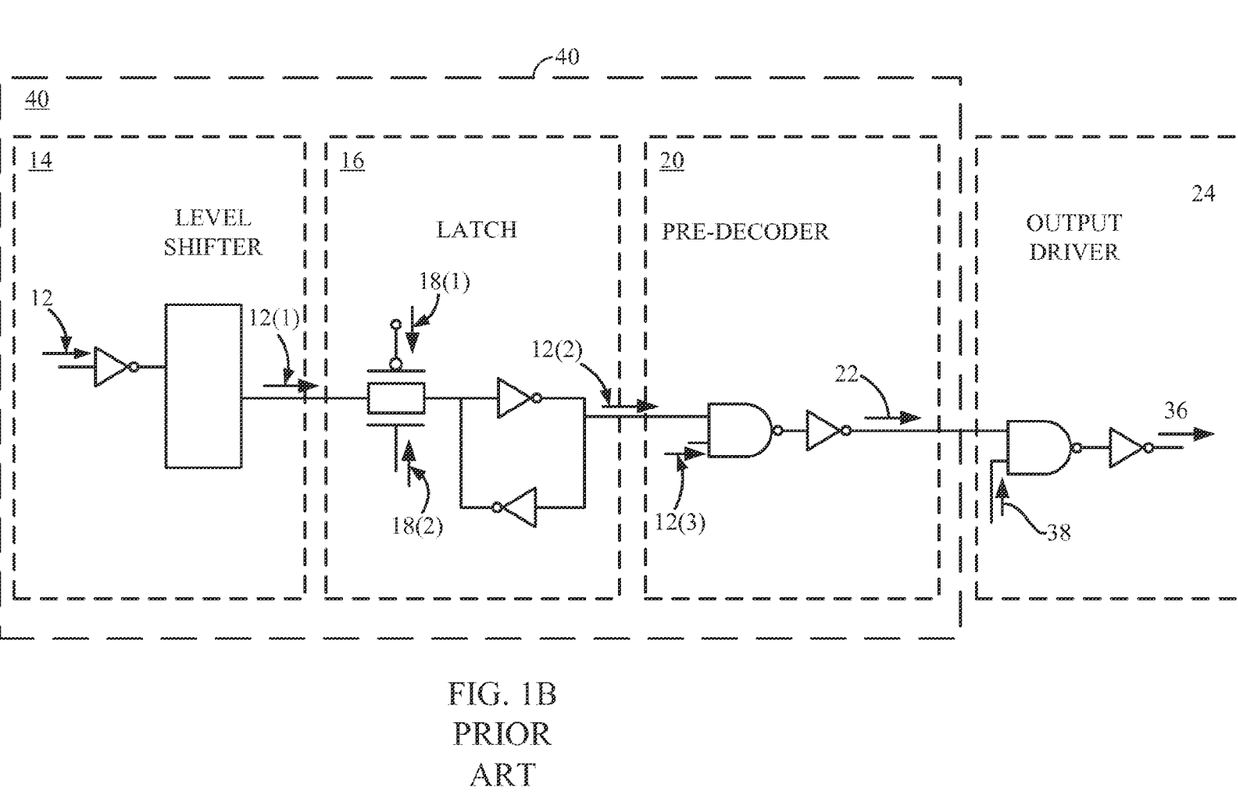
FIG. 1B illustrates a specific example of the memory pre-decoder circuit shown in FIG. 1A.

A generalized example of a memory pre-decoder circuit 10 is shown in FIG. 1A. FIG. 1B illustrates a specific example of the memory pre-decoder circuit 10 shown in FIG. 1A. The memory pre-decoder circuit 10 is configured to receive a memory address input 12 from a CPU core (not shown). The memory address input 12 in FIGS. 1A and 1B is a single bit of a memory address. However, it should be noted that additional memory pre-decoder circuits are typically provided, in parallel to pre-decode different portions of the memory address from the CPU core.

If the CPU core is powered in a lower voltage domain, the memory address input 12 is received by the memory pre-decoder circuit 10 in the lower voltage domain. However, memory systems, such as SRAM, DRAM, ROM, EPROM, EEPROM, etc., are generally powered by a higher voltage to be provided in a higher voltage domain. This allows the memory system to maintain a threshold voltage and preserve the integrity of data stored in the memory cells. Accordingly, the memory pre-decoder circuit 10 includes a voltage level shifter 14 that level shifts the memory address input 12 into the higher voltage domain. After being level shifted into the higher voltage domain, a level shifted memory address input 12(1) is then provided to a latch 16 clocked by a latch clock signal 18. In FIG. 1B, the latch clock signal 18 is actually received as a latch clock signal 18(1) and an inversion of the latch clock signal 18(1) is received as a latch clock signal 18(2). The level shifted memory address input 12(1) is then latched in accordance with the latch clock signal 18(1) and the latch clock signal 18(2) to provide a latched memory address input 12(2) in the higher voltage domain. The latch clock signal 18 and the latch clock signal 18(1) may be received as a system clock from the CPU core.

A memory pre-decoder 20 receives the latched memory address input 12(2) from the latch 16. In addition, as shown in FIG. 1B, the memory pre-decoder 20 receives another latched memory address input 12(3) in the higher voltage domain from another latch (not shown). The memory pre-decoder 20 then generates a pre-decoder output 22 based on the latched memory address input 12(2) and the other latched memory address input 12(3). The pre-decoder output 22 from the memory pre-decoder 20 is then provided to an output driver 24. The output driver 24 generates a gated pre-decoder output 36 to a final downstream decoder (not shown). The output driver 24 needs to gate the pre-decoder output 22 due to the propagation delay from the latch 16 to the output driver 24. More particularly, the output driver 24 cannot be clocked by the system clock (latch clock 18(1)). Rather, the output driver 24 is clocked by a root clock signal 38 as a result of the propagation delay. The root clock signal 38 must be delayed with respect to the system clock (latch clock 18(1)) by at least the propagation delay from the latch 16 to the output driver 24. Thus, this propagation delay must be part of the setup time.

Additionally, other gated pre-decoder outputs (not shown) may be transmitted to the final downstream decoder from other parallel output drivers shown). Since the voltage level shifter 14, the latch 16, and the memory pre-decoder 20 must setup the signal level of the pre-decoder output 22 before the output driver 24 can generate the gated pre-decoder output 36, the voltage level shifter 14, the latch 16, and the memory pre-decoder 20 are provided in a memory pre-decode setup path 40 of the memory pre-decoder circuit 10. Considering that the gated pre-decoder output 36 is generated in accordance with the root clock signal 38, the setup time delay resulting from the memory pre-decode setup path 40 is included in the overall setup time required for accessing memory.

As further shown in FIG. 1B, once the gated pre-decoder output 36 has been setup and the root clock signal 38 generates the gated pre-decoder output 36, another access delay of two gates is needed by the output driver 24. Furthermore, the memory pre-decode setup path 40 of the memory pre-decoder circuit 10 provides one gate for an input buffer in the voltage level shifter 14, two gates for level shifting circuitry of the voltage level shifter 14, two gates for the latch 16, and two gates for the memory pre-decoder 20. Increased setup time increases memory access times and slows down memory. Therefore, it may be desirable to reduce the setup time in the memory pre-decode setup path 40 of the memory pre-decoder circuit 10. Providing faster access to memory can increase the performance speed of computer-based devices.

SUMMARY OF THE DISCLOSURE

Embodiments disclosed in the detailed description include memory pre-decoder circuits employing pulse latch(es) for reducing memory access setup times and related systems and methods. More specifically, embodiments of the disclosure include memory pre-decoder circuits and methods that reduce setup times and increase memory access speeds as a result. In this regard in one embodiment, the memory pre-decoder circuit includes a memory pre-decoder within a memory pre-decode setup path. The memory pre-decoder is configured to pre-decode a memory address input and generate a pre-decoded memory address input. Rather than latching in the memory pre-decode setup path, a pulse latch is provided in the memory pre-decoder circuit outside of the memory pre-decode setup path. The pulse latch samples the pre-decoded memory address input based on a clock signal. As such, the memory pre-decode setup path sets up the pre-decoded memory address input prior to the clock signal for the pulse latch. In this manner, the pulse latch is configured to generate a pre-decoded memory address output without increasing setup times in the memory pre-decode setup path. When the memory pre-decoder circuit is implemented in a memory system, a downstream decoder of the memory system may then receive the pre-decoded memory address output from the pulse latch and access a segment of memory based on the pre-decoded memory address output. Setup times for memory access are therefore reduced.

In another embodiment, a memory pre-decoder circuit is provided. The memory pre-decoder circuit includes a means for pre-decoding a memory address input within a memory pre-decode setup path to generate a pre-decoded memory address input. Furthermore, the memory pre-decoder circuit includes a means for sampling the pre-decoded memory address input outside of the memory pre-decode setup path based on a clock signal. Additionally, a means for generating a pre-decoded memory address output outside of the memory pre-decode setup path In another embodiment, a method of pre-decoding a memory address input for a memory system is provided. In this embodiment, the memory address input is pre-decoded within a memory pre-decode setup path to generate a pre-decoded memory address input. The pre-decoded memory address input is sampled outside of the memory pre-decode setup path based on a clock signal. Additionally, a pre-decoded memory address output is generated outside of the memory pre-decode setup path. The pre-decoded memory address output may be utilized by a final decoder to access memory.

DETAILED DESCRIPTION

With reference now to the drawing figures, several exemplary embodiments of the present disclosure are described. The word "exemplary" is used herein to mean "serving as an example, instance, or illustration." Any embodiment described, herein as "exemplary" is not necessarily to be construed as preferred or advantageous over other embodiments.

Embodiments disclosed in the detailed description include memory pre-decoder circuits employing pulse latch(es) for reducing memory access setup times and related systems and methods. More specifically, embodiments of the disclosure include memory pre-decoder circuits and methods that reduce setup times and increase memory access speeds as a result. In this regard in one embodiment, the memory pre-decoder circuit includes a memory pre-decoder within a memory pre-decode setup path. The memory pre-decoder is configured to pre-decode a memory address input and generate a pre-decoded memory address input. Rather than latching in the memory pre-decode setup path, a pulse latch is provided in the memory pre-decoder circuit outside of the memory pre-decode setup path. The pulse latch samples the pre-decoded memory address input based on a clock signal. As such, the memory pre-decode setup path sets up the pre-decoded memory address input prior to the clock signal for the pulse latch. In this manner, the pulse latch is configured to generate a pre-decoded memory address output without increasing setup times in the memory pre-decode setup path. When the memory pre-decoder circuit is implemented in a memory system, a downstream decoder of the memory system may then receive the pre-decoded memory address output from the pulse latch and access a segment of memory based on the pre-decoded memory address output. Setup times for memory access are therefore reduced.

Figure 2:
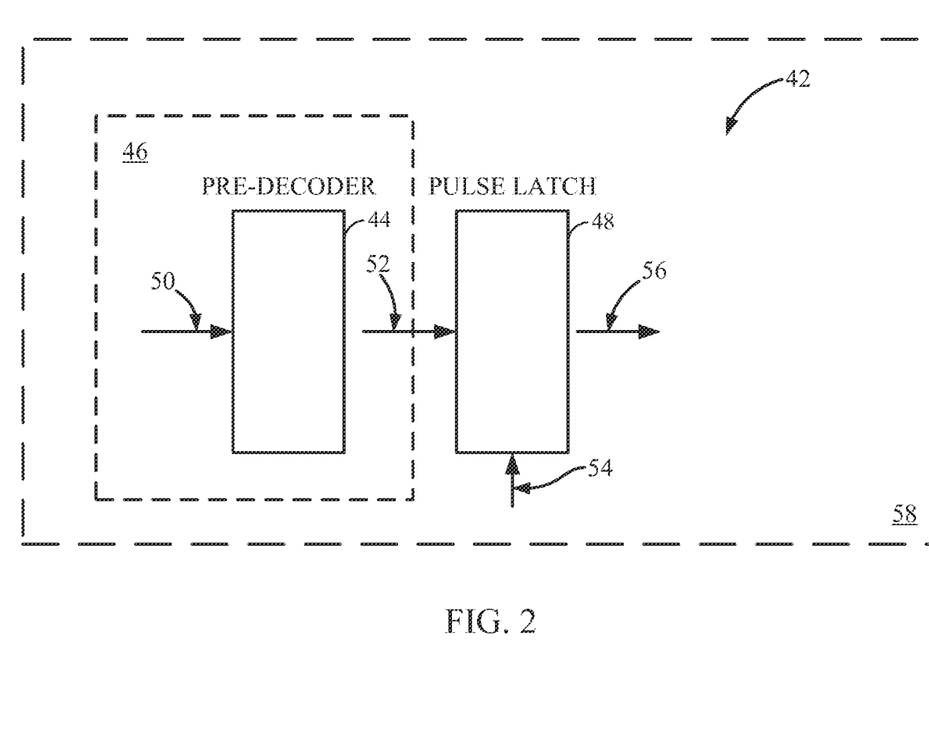
FIG. 2 illustrates a block diagram of an exemplary memory pre-decoder circuit including a pre-decoder within a memory pre-decode setup path configured to generate a pre-decoded memory address input and a pulse latch outside of the memory pre-decode setup path configured to generate a pre-decoded memory address output.

In this regard, FIG. 2 illustrates a block diagram of an exemplary memory pre-decoder circuit 42. The memory pre-decoder circuit 42 includes a memory pre-decoder 44 in a memory pre-decode setup path 46 and pulse latch 48 outside of the memory pre-decode setup path 46. Accordingly, the memory pre-decode setup path 46 of the memory pre-decoder circuit 42 includes the memory pre-decoder 44, and does not include voltage level shifters or latches. The memory pre-decoder circuit 42 receives a memory address input 50. In this embodiment, the memory pre-decoder circuit 42 receives the memory address input 50 in a lower voltage domain. The memory address input 50 may be, or may be part of, a memory address that identifies a location in memory (not shown). The pre-decoding provided by the memory pre-decoder circuit 42 is utilized to partially decode the memory address. This allows for the simplification of downstream peripheral circuitry, such as a final decoder (not shown) of a memory system. Since the memory pre-decode setup path 46 does not include voltage level shifters or latches, a setup time of the memory pre-decoder circuit 42 is reduced thereby providing for faster memory access.

With continuing reference to FIG. 2, the memory pre-decoder 44 is configured to pre-decode the memory address input 50 to generate a pre-decoded memory address input 52. While other embodiments of the memory pre-decode setup path 46 may provide voltage level shifting in the memory pre-decode setup path 46, this embodiment of the memory pre-decode setup path 46 does not require voltage level shifting. Accordingly, the memory pre-decoder 44 shown in FIG. 2 is configured to pre-decode the memory address input 50 in the lower voltage domain to generate a pre-decoded memory address input 52 in the lower voltage domain. The pulse latch 48 is configured to sample the pre-decoded memory address input 52 in the lower voltage domain based on a clock signal 54. The pulse latch 48 samples the pre-decoded memory address input 52 on an active edge of the clock signal 54. The pulse latch 48 in FIG. 2 is presumed to sample the pre-decoded memory address input 52 in response to a rising edge of the clock signal 54. However, in alternative embodiments, the pulse latch 48 may be configured to sample the pre-decoded memory address input 52 in response to a falling edge of the clock signal 54. In any case, a signal level is stored in the pulse latch 48 according to a signal level of the pre-decoded memory address input 52 in the lower voltage domain. The pulse latch 48 is configured to generate a pre-decoded memory address output 56. The pre-decoded memory address output 56 is launched during the active edge of the clock signal 54 in accordance with the signal level stored by the pulse latch 48. The signal level of the pre-decoded memory address output 56 is held until the next active edge of the clock signal 54 occurs. More specifically, the pulse latch 48 again becomes transparent and samples the pre-decoded memory address input 52 in response to the next active edge of the clock signal 54.

Although not required, the pulse latch 48 shown in FIG. 2 samples the pre-decoded memory address input 52 in the lower voltage domain but generates the pre-decoded memory address output 56 in the higher voltage domain. As a result, a voltage level shifter does not have to be provided in the memory pre-decode setup path 46 of the memory pre-decoder circuit 42. Additionally, since the pulse latch 48 provides storage and isolation for pipelining, the memory pre-decode setup path 46 does not require a separate latch. Finally, the pulse latch 48 may also actively power the pre-decoded memory address output 56 and, thus, separate output drivers may not be necessary.

While not specifically illustrated in FIG. 2, the memory pre-decoder circuit 42 may include other parallel memory pre-decoders and pulse latches, like the memory pre-decoder 44 and pulse latch 48. Other portions of the memory address may be received as the memory address input by the parallel memory pre-decoders so that the memory pre-decoder circuit 42 can pre-decode different parts of the memory address. The parallel pulse latches may thus each provide a parallel pre-decoded memory address output, like the pre-decoded memory address output 56 of FIG. 2, based on the particular part of the memory address received as the memory address input. In this manner, the memory pre-decoder circuit 42 can pre-decode different parts of the memory address. The parallel pre-decoded memory address outputs may be provided to a downstream final decoder of the memory system. The final decoder accesses the appropriate segment of the memory based on the parallel pre-decoded memory address outputs, including the pre-decoded memory address output 56 of FIG. 2. The memory pre-decoder circuit 42 may be included and/or operate with memory systems such as SRAM, DRAM, ROM, EPROM, EEPROM, and/or the like.

The memory pre-decoder 44 shown in FIG. 2 generates the pre-decoded memory address input 52 as a pre-decoded input of a pre-decoded memory address in this example. The pre-decoded input is representative of information for selecting a wordline and/or a bitline in the memory. The pulse latch 48 is configured to receive the pre-decoded memory address input 52 from the memory pre-decoder 44 as the pre-decoded input of the pre-decoded memory address. The pre-decoded memory address output 56 is thus generated by the pulse latch 48 as a pre-decoded output of the pre-decoded memory address. The pre-decoded output (and other pre-decoded outputs from other pulse latches in parallel implementations) may be provided to a final downstream (row/bitline) decoder (s) (not shown). In response, the decoder may select a wordline/bitline of memory cells in the memory based on the pre-decoded output along with the other pre-decoded outputs from pulse latches in parallel implementations).

Referring again to FIG. 2, the memory pre-decoder circuit 42 has been integrated into a semiconductor die 58. As such, the memory pre-decoder 44 in the memory pre-decode setup path 46 and the pulse latch 48 are circuits integrated into the semiconductor die 58. Although not specifically illustrated in FIG. 2, the other parallel memory pre-decoders and pulse latches of the memory pre-decoder circuit 42, as discussed above, may also be integrated in the semiconductor die 58. Furthermore, other upstream and downstream circuitry may be integrated in the semiconductor die 58, if desired.

Figure 3:
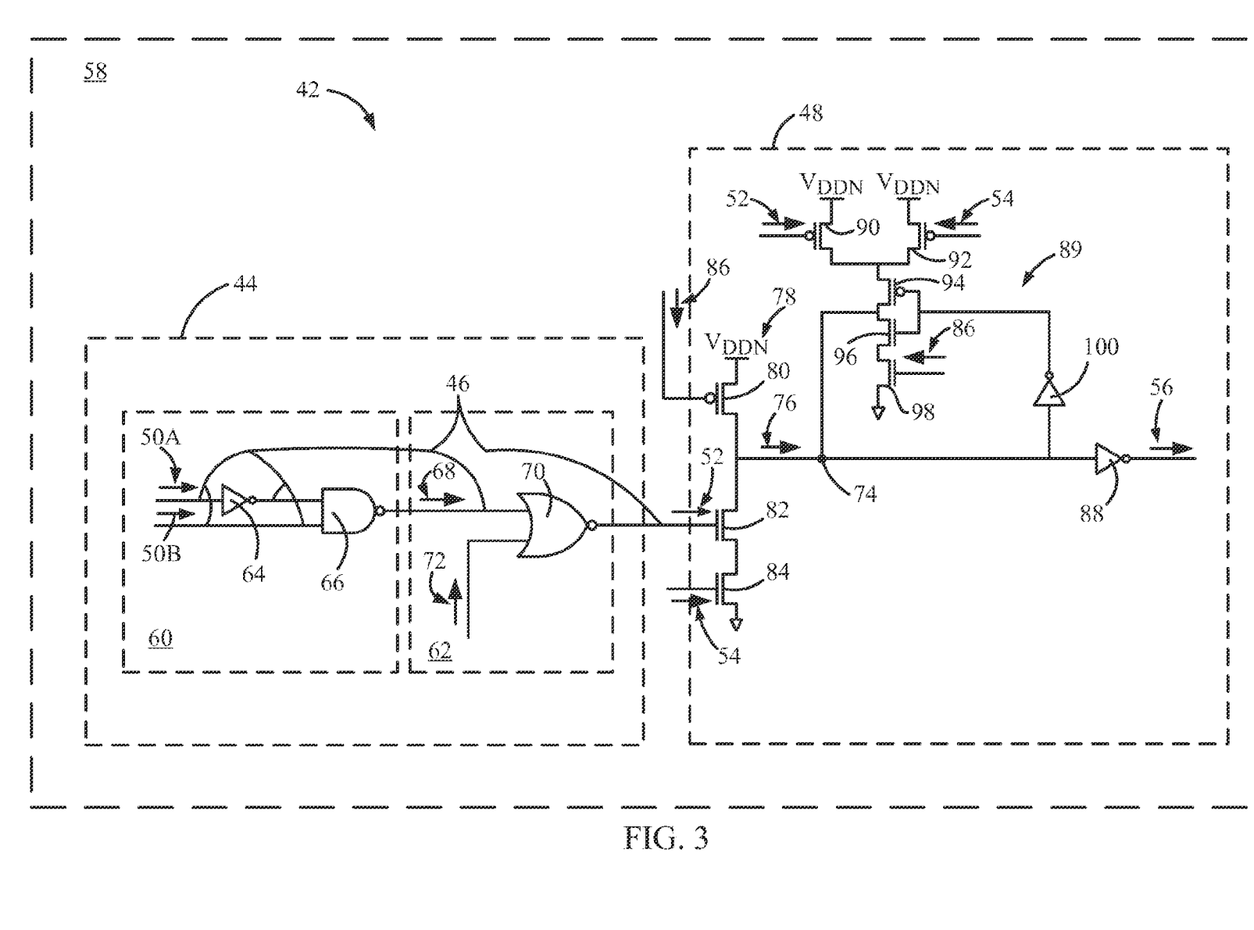
FIG. 3 illustrates a circuit diagram of one embodiment of the memory pre-decoder circuit shown in FIG. 2, wherein the memory pre-decoder circuit includes one embodiment of the memory pre-decoder and one embodiment of the pulse latch having a storage node.

FIG. 3 illustrates a more detailed circuit diagram of one embodiment of the memory pre-decoder circuit 42 in FIG. 2. In particular, the circuit diagram in FIG. 3 includes exemplary embodiments of the memory pre-decoder 44 within the memory pre-decode setup path 46 and the pulse latch 48 of FIG. 2 outside of the memory pre-decode setup path 46. In the memory pre-decode setup path 46, the memory pre-decoder 44 includes an address pre-decode logic circuit 60 and a reset circuit 62. The address pre-decode logic circuit 60 receives the memory address input 50 as a plurality of address line inputs (referred to individually as elements 50A, 50B). The address line inputs 50A, 50B of this embodiment are a first address line input 50A and a second address line input 50B, which are bits from a memory address. In this example, the first address line input 50A is received initially by an inverter gate 64. After inversion by the inverter gate 64, the first address line input 50A is provided to a NAND gate 66 in the address pre-decode logic circuit 60. The second address line input 50B is directly received by the NAND gate 66.

The address pre-decode logic circuit 60 is configured to pre-decode the address line inputs 50A, 50B and generate an intermediary pre-decoded address signal 68 from the pre-decode of the address line inputs 50A, 50B. A signal level of the intermediary pre-decoded address signal 68 represents pre-decoded information for downstream circuitry. In this example, the NAND gate 66 generates the intermediary pre-decoded address signal 68. It should be noted that while the address pre-decode logic circuit 60 has the inverter gate 64 and the NAND gate 66, this logic topology is not required. Other embodiments of the address pre-decode logic circuit 60 may have alternative logic topology depending on the pre-decoding scheme of the memory pre-decoder circuit 42.

The reset circuit 62 in the memory pre-decoder 44 is configured to receive the intermediary pre-decoded address signal 68 from the address pre-decode logic circuit 60 and generate the pre-decoded memory address input 52 in accordance with the intermediary pre-decoded address signal 68. As explained in further detail below, the pulse latch 18 in FIG. 3 receives the pre-decoded memory address input 52 from the reset circuit 62 and generates the pre-decoded memory address output 56 based on the pre-decoded memory address input 52. In the exemplary embodiment shown in FIG. 3, the reset circuit 62 is provided by a NOR gate 70, which is configured to receive the the intermediary pre-decoded address signal 68. Alternative embodiments of the reset circuit 62 may be implemented using additional and/or different types of logic gates. However, the reset circuit 62 shown in FIG. 2 is provided by a single logic gate thereby minimizing the length of the memory pre-decode setup path 16.

To close the pulse latch 48, the reset circuit 62 is configured to receive a reset signal 72. When the pulse latch 48 is closed, the pulse latch 48 is opaque and changes in the voltage level of the intermediary pre-decoded address signal 68 do not affect the voltage level of the pre-decoded memory address output 56. In this exemplary embodiment, the NOR gate 70 receives the reset signal 72. When the reset signal 72 is in a non-reset signal state, the reset circuit 62 is configured to generate the pre-decoded memory address input 52 in accordance with the intermediary pre-decoded address signal 68. Since the NOR gate 70 is provided in this particular embodiment of the reset circuit 62, the reset signal 72 is in a non-reset signal state when the reset signal 72 has a lower signal level.

In contrast, the reset circuit 62 in FIG. 3 is configured to reset the pre-decoded memory address input 52 when the reset signal 72 is in a reset signal state. Since the NOR gate 70 is used in this particular embodiment of the reset circuit 62, the pre-decoded memory address input 52 is reset when the reset signal 72 has a higher signal level. More specifically, the NOR gate 70 generates the pre-decoded memory address input 52 with a lower voltage level (i.e., a logical "0") when the reset signal 72 has a higher voltage level (i.e., a logical "1"), regardless of the voltage level of the intermediary pre-decoded address signal 68. The pulse latch 48 thus becomes opaque to changes in the intermediary pre-decoded address signal 68 and also the address line inputs 50A, 50B while the reset signal 72 is in the reset signal state. Accordingly, even if the clock signal 54 is active, the pulse latch 48 becomes opaque and is consequently closed during reset. Once the reset signal 72 returns to the non-reset signal state, the pulse latch 48 may open again when the clock signal 54 becomes active.

The memory pre-decode setup path 46 has setup the pre-decoded memory address input 52 before the clock signal 54. Accordingly, the setup time for the pre-decoded memory address input 52 is determined with respect to the clock signal 54. More specifically, the setup time required by the memory pre-decoder 44 shown in FIG. 2 is approximately equal to the combined propagation delay of the inverter gate 64, NAND gate 66, and NOR gate 70. Accordingly, as no latch or voltage level shifter is required in the memory pre-decode setup path 46 of the memory pre-decoder circuit 42 shown in FIG. 3, the setup time of the memory pre-decode setup path 46 is only three "gates" long. Also, since the clock signal 54 does not need to be delayed with respect to another clock signal, the pulse latch 48 can generate the pre-decoded memory address output 56 using a system clock from a CPU core as the clock signal 54.

Although not specifically illustrated in FIG. 3, each of the components of the memory pre-decoder 44 operates in the lower voltage domain. Accordingly, the address line inputs 50A, 50B, the intermediary pre-decoded address signal 68, and the pre-decoded memory address input 52 are each in the lower voltage domain. The voltage level of the bits of the address line inputs 50A, 50B, and the intermediary pre-decoded address signal 68 are, thus, represented in accordance with the voltage levels provided by the lower voltage domain. The address line inputs 50A, 50B may be from a CPU core (not shown) that is powered in the lower voltage domain. Similarly, supply voltages that power the inverter gate 64, the NAND gate 66, and the NOR gate 70 are also configured in the lower voltage domain. If the reset signal 72 has not already closed the pulse latch 48, the pulse latch 48 becomes opaque when the clock signal 54 is inactive. Otherwise, if the reset signal 72 has already closed the pulse latch 48, the pulse latch 48 remains opaque while the clock signal 54 is inactive. The pulse latch 48 becomes transparent when the clock signal 54 is active, in this embodiment, the memory pre-decoder 44 is dynamic rather than static because the memory pre-decode setup path 46 does not latch the memory address inputs 50A, 50B, the intermediary pre-decoded address signal 68, or the pre-decoded memory address input 52. Thus, changes to the pre-decoded memory address input 52 due to new memory address inputs 50A, 50B can be initiated as soon as the new memory address inputs 50A, 50B are received. The pre-decoded memory address input 52 may thus be available immediately when the clock signal 54 becomes active.

The pulse latch 48 shown in FIG. 3 has a storage node 74. Throughout this disclosure, the signal level stored at the storage node 74 is a voltage level. However, alternative embodiments of the pulse latch 48 may store different types of signal levels as would be apparent to one of ordinary skill in the art in light of this disclosure. When the clock signal 54 is active, the pulse latch 48 is configured to sample the pre-decoded memory address input 52 in the lower voltage domain. In the particular configuration shown in FIG. 3, the pulse latch 48 samples the pre-decoded memory address input 52 by passing the pre-decoded memory access input 52 to the storage node 74 in response to the activating edge of the clock signal 54. Additionally, this embodiment of the first stage 78 is configured to provide voltage level shifting and the pulse latch 48 operates in a higher voltage domain. The supply voltage of the higher voltage domain is represented by the voltage level $V_{DDH}$. Accordingly, the pulse latch 48 shown in FIG. 2 samples the pre-decoded memory address input 52 by passing the pre-decoded memory address input 52 in the lower voltage domain to the storage node 74 as a preliminary pre-decoded memory address output 76 in the higher voltage domain once the clock signal 54 becomes active.

When the clock signal 54 is active, the pulse latch 48 is transparent because changes in the intermediary pre-decoded address signal 68 (and thus, the address line inputs 50A, 50B) affect the voltage level stored in the storage node 74. It should be noted, however, that the pulse latch 48 may not be transparent for the entire time that the clock signal 54 is active. As discussed above, the reset circuit 62 may close the pulse latch 48 in response to the reset signal 72 and the pulse latch 48 becomes opaque prior to the clock signal 54 becoming inactive. Conversely, the pulse latch 48 may become opaque once the clock signal 54 becomes inactive. In either case, the pulse latch 48 remains opaque while the clock signal 54 is inactive. The pulse latch 48 once again becomes transparent when the clock signal 54 becomes active again. Consequently, the pulse latch 48 is configured to sample the pre-decoded memory address input 52 based on the clock signal 54.

With continuing reference to FIG. 3, the pulse latch 48 has a first stage 78 that includes a P-channel field effect transistor (FET) 80, an N-channel FET 82, and an N-channel FET 84. A gate of the N-channel FET 82 receives the pre-decoded memory address input 52 and a gate of the N-channel FET 84 receives the clock signal 54. To pipeline the signal value of the pre-decoded memory address input 52 to the storage node 74, the signal value of the pre-decoded memory address input 52 should be setup by the memory pre-decoder 44 prior to the active edge of the clock signal 54. In this case, the clock signal 54 is active when the clock signal 54 has a higher signal level. Prior to the rising edge of the clock signal 54, the P-channel FET 80 receives a ready signal 86 that turns on the P-channel FET 80. As a result, the ready signal 86 is provided to have a lower signal level.

The first stage 78 of the pulse latch 48 passes the pre-decoded memory address input 52 to the storage node 74 as the preliminary pre-decoded memory address output 76. The first stage 78 provides the preliminary pre-decoded memory address output 76 as an inverted version of the pre-decoded memory address input 52 but in the higher voltage domain. For example, if the pre-decoded memory address input 52 is setup at the gate of the N-channel FET 82 to have a higher voltage level (i.e., a logical "1") in the lower voltage domain, the rising edge of the clock signal 54 results in both the N-channel FET 82 and the N-channel FET 84 being turned on. When both the N-channel FETs 82, 84 are turned on, the N-channel FETs 82, 84 force the P-channel 80 to be turned off despite the lower voltage level at the gate of the P-channel FET 80. As a result, the majority of the voltage $V_{DDH}$ is dropped across the P-channel FET 80. The preliminary pre-decoded memory address output 76 is provided at a voltage level near ground level. This is the lower voltage level a logical "0") in the higher voltage domain. Accordingly, when the pre-decoded memory address input 52 is setup to have the higher voltage level (i.e., a logical "1") in the lower voltage domain, the pulse latch 48 stores the preliminary pre-decoded memory address output 76 with a lower signal level (i.e., a logical "0") in the higher voltage domain at the storage node 74.

Conversely, the pre-decoded memory address input 52 may be setup at the gate of the N-channel FET 82 to have a lower voltage level (i.e., a logical "0") in the lower voltage domain. When the clock signal 54 is active, both the N-channel FETs 82, 84 are turned off. This is because the lower signal level at the gate of the N-channel FET 82 turns off the N-channel FET 82 and thus, the N-channel FET 84 cannot be turned on despite the higher signal level (i.e., a logical "1" of the clock signal 54) at its gate. The P-channel FET 80 thus remains on and the majority of the voltage $V_{DDH}$ is dropped across the N-channel FETs 82, 84. Accordingly, when the pre-decoded memory address input 52 is setup to have the lower voltage level (i.e., a logical "0") in the lower voltage domain, the pulse latch 48 stores the preliminary pre-decoded memory address output 76 with a higher voltage level (i.e., a logical "1") in the higher voltage domain at the storage node 74.

Once the voltage level at the storage node 74 in FIG. 3 has stabilized, the pulse latch 48 should be closed. Closing the pulse latch 48 avoids changes in the intermediary pre-decoded address signal 68 and the address line inputs 50A and 50B from entering into the storage node 74 too early. To prevent untimely changes, the memory pre-decoder 44 is configured to receive the reset signal 72 and close the storage node 74 of the pulse latch 48 when the reset signal 72 is in the reset signal state. As discussed above, the NOR gate 70 receives the reset signal 72 in the reset signal state to close the pulse latch 48. Accordingly, the pre-decoded memory address input 52 is reset to a lower voltage level (i.e., a logical "0") regardless of the voltage level of the intermediary pre-decoded address signal 68. As a result, the N-channel FET 82 must be turned off in response to the reset signal 72 being provided in the reset signal state. The pulse latch 48 becomes opaque since the voltage level stored at the storage node 74 is unresponsive to changes in the intermediary pre-decoded address signal 68 and the address line inputs 50A and 50B. As the pulse latch 48 is opaque for at least as long as the reset signal 72 is in the reset signal state, the reset signal 72 sets a minimum hold time of the pulse latch 48.

At some point, the clock signal 54 is provided with a falling edge and as a result, becomes inactive. Since the N-channel FET 84 is turned off when the clock signal 54 is inactive, the pulse latch 48 remains opaque and holds the voltage level at the storage node 74 as long as the clock signal 54 is inactive. Thus, if the clock signal 54 is inactive after the reset signal 72 returns to the non-reset signal state, the pulse latch 48 will nevertheless remain opaque.

The pulse latch 48 is configured to generate the pre-decoded memory address output 56 in the higher voltage domain based on the preliminary pre-decoded memory address output 76 from the storage node 74. In this embodiment, the pulse latch 48 includes an inverter gate 88 and the pre-decoded memory address output 56 is inverted with respect to the preliminary pre-decoded memory address output 76 from the storage node 74. The first stage 78 of the pulse latch 48 has a propagation delay approximately equal to one gate; the inverter gate 88 also has a propagation delay approximately equal to one gate. Accordingly, the pulse latch 48 is configured to generate the pre-decoded memory address output 56 within two gates of the clock signal 54.

To hold the voltage level at the storage node 74 while the pulse latch 48 is opaque, the pulse latch 48 employs a feedback stage 89. The feedback stage 89 includes a P-channel FET 90, a P-channel FET 92, a P-channel FET 94, an N-channel FET 96, and an N-channel FET 98. The gate of the P-channel FET 90 receives the pre-decoded memory address input 52 and the gate of the P-channel FET 92 receives the clock signal 54. The feedback stage 89 also includes an inverter gate 100 coupled to the gates of the P-channel FET 94 and the N-channel FET 96. The gate of the N-channel FET 98 receives the ready signal 86. To hold the voltage level at the storage node 74, the ready signal 86 is transitioned to a higher signal level as the reset signal 72 is transitioned to the reset signal state. Accordingly, the N-channel FET 98 is allowed to be turned on and provide a path to ground.

When the pulse latch 48 becomes opaque due to the reset signal 72, the reset signal 72 and the clock signal 54 are at the higher signal level. Since the reset signal 72 is at the higher signal level, the P-channel FET 90 receives the pre-decoded memory address input 52 with the lower voltage level from the NOR gate 70. As a result, the P-channel FET 90 is turned on. After the reset signal 72 closes the pulse latch 48, the reset signal 72 may return to the lower signal level, and the clock signal 54 may transition to the lower signal level. Due to the clock signal 54 being inactive, the P-channel FET 92 is turned on. Accordingly, whenever the pulse latch 48 is opaque, either the P-channel FET 90 and/or the P-channel FET 92 are turned, on by a lower voltage level. The voltage level at the storage node 74, which was provided by the first stage 78 of the pulse latch 48 while the pulse latch 48 was transparent, is reinforced by the feedback stage 89 when the pulse latch 48 is opaque. In this embodiment, the drains of the P-channel PET 94 and the N-channel PET 96 reinforce the voltage level at the storage node 74.

For example, when the voltage level at the storage node 74 is at the higher voltage level, the gates of the P-channel FET 94 and N-channel FET 96 receive a lower voltage level. Accordingly, the drains of the P-channel FIT 94 and the N-channel FET 96 and thus, the storage node 74 are driven to the higher voltage level, which is near $V_{DDH}$. In contrast, if the voltage level at the storage node 74 is at a lower voltage level, the gates of the P-channel FET 94 and the N-channel FIT 96 receive a higher voltage level. The drains of the P-channel FET 94 and the N-channel FET 96 are driven towards the lower voltage level near ground. The feedback stage 89 thus holds the voltage level at the storage node 74 when the pre-decoded memory address input 52 is provided to the P-channel FET 90 at the lower signal level due to the reset signal 72, and when the P-channel FET 92 receives the clock signal 54 at the lower signal level.

Prior to the clock signal 54 again becoming active, the ready signal 86 may again be transitioned to the higher signal level. This deactivates the feedback stage 89. The pulse latch 48 again becomes transparent on the next rising edge of the clock signal 54. The first stage 78 of the pulse latch 48 again passes the pre-decoded memory address input 52 in the lower voltage domain to the storage node 74 as the preliminary pre-decoded memory address output 76 in the higher voltage domain. Thus, changes in the intermediary pre-decoded address signal 68 and the address line inputs 50A, 50B do not affect the voltage level at the storage node 74 until the subsequent rising edge of the clock signal 54 occurs. The above described process may be again repeated by the pulse latch 48 for the new voltage level at the storage node 74.

By using the reset signal 72 to close the pulse latch 48, the pulse latch 48 does not require a deactivating edge of the clock signal 54 to close, instead, the pulse latch 48 may be closed by either the reset signal 72 or the clock signal 54. Thus, some implementations of the pulse latch 48 may use a system clock from a CPU core (not shown), or the like, as the clock signal 54. The reset signal 72 may be generated by a replica circuit (not shown) that mimics the pulse latch 48 and generates the reset signal 72 with the reset signal state whenever the voltage level of the storage node 74 has been stabilized, in some implementations, the reset signal 72 resets the pre-decoded memory address input 52 and thus closes the pulse latch 48 each time the clock signal 54 is active.

Figure 4:
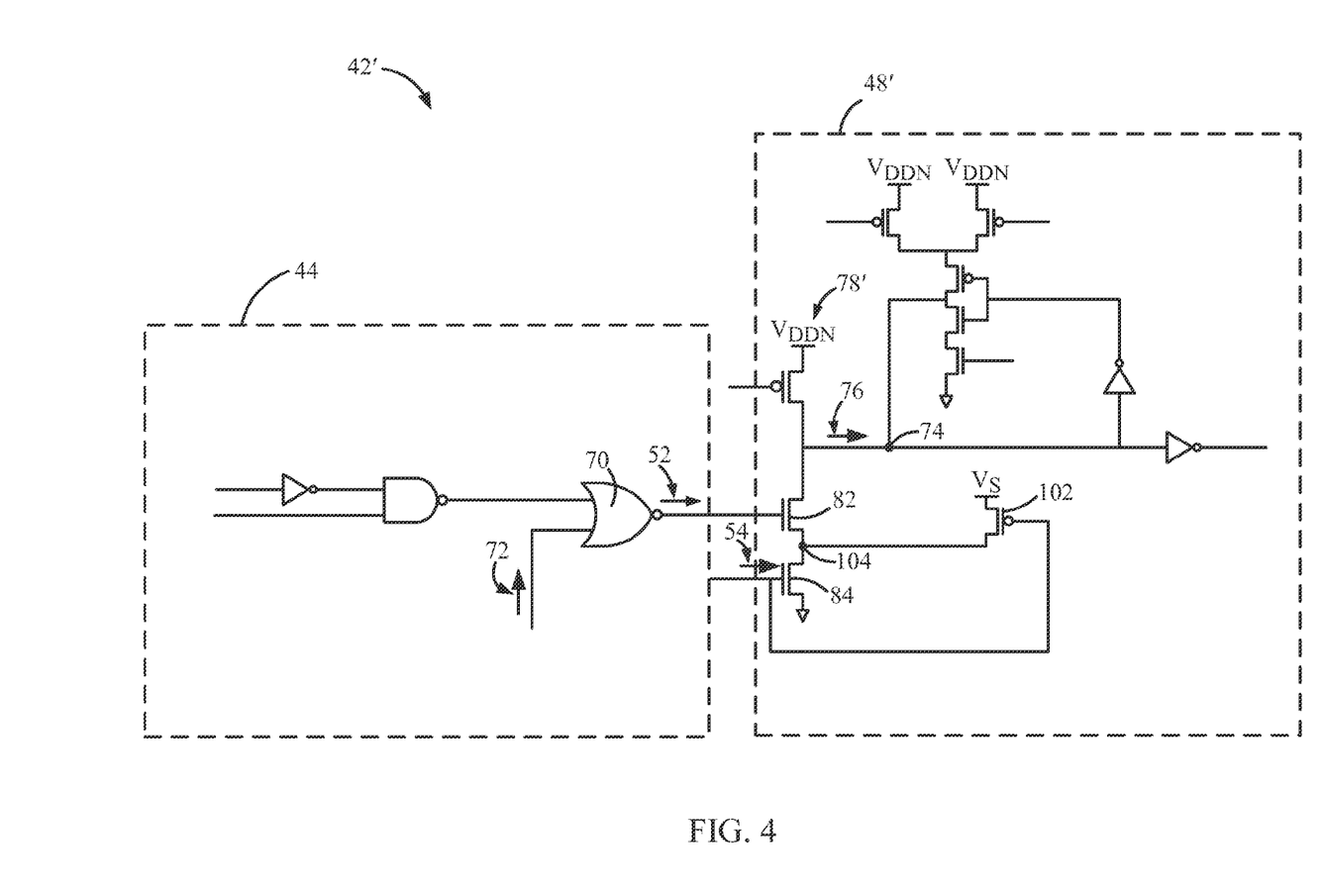
FIG. 4 illustrates a circuit diagram of another embodiment of the memory pre-decoder circuit shown in FIG. 2, wherein the memory pre-decoder circuit includes the memory pre-decoder of FIG. 3, and exemplary pulse latch including a pre-charge device to address potential charge sharing issues at the storage node.

FIG. 4 illustrates a circuit diagram of another embodiment of the memory pre-decoder circuit 42' shown in FIG. 2. This memory pre-decoder circuit 42' includes the same memory pre-decoder 44 shown in FIG. 3. A pulse latch 48' provided that is similar to the pulse latch 48 described above in FIG. 3, except that the pulse latch 48' in FIG. 4 includes a pre-charge component 102. The pre-charge component 102 is used to address charge sharing issues. In this case, the pre-charge component 102 is coupled between the N-channel FET 82 and the N-channel FET 84 in the first stage 78' of the pulse latch 48'. The pre-charge component 102 is a P-channel FET that is coupled to a voltage $V_g$ and to a node 104 between the N-channel FET 82 and N-channel FET 84. The gate of the pre-charge component 102 receives the clock signal 54.

When the clock signal 54 is active, the clock signal 54 turns on the N-channel FET 84 but turns off the pre-charge component 102. In this case, a lower voltage level near ground is seen at node 104. To prevent the N-channel FET 82 from being charged with the entire load, the pre-charge component 102 is turned on when the clock signal 54 is inactive. Accordingly, a voltage of Vg is presented at the node 104. In this manner, the load of the storage node 74 may be distributed between the N-channel FET 82 and N-channel FET 84. To reduce the load presented by the clock signal 54, the node 104 may be shared across other parallel pulse latches (not shown).

Figure 5:
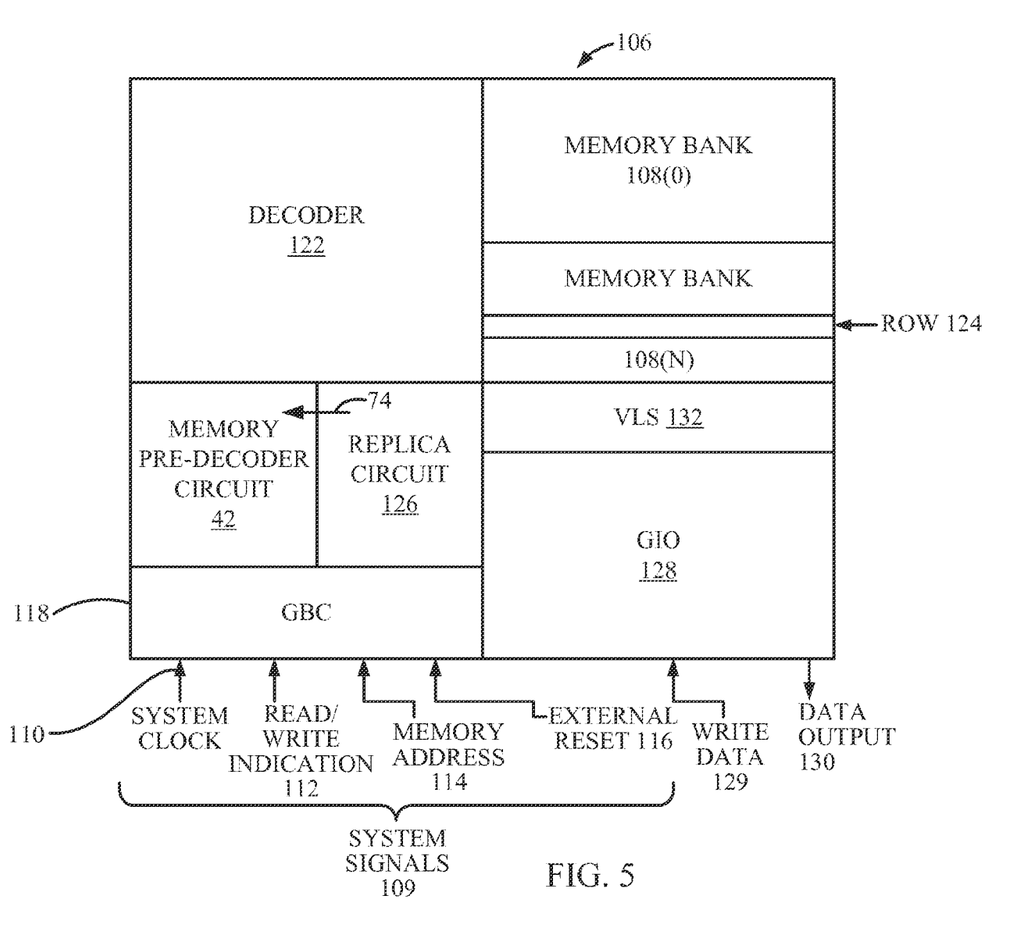
FIG. 5 illustrates one embodiment of a memory system having the memory pre-decoder circuit in FIG. 2.

FIG. 5 illustrates one embodiment of a memory system 106 that can include the memory pre-decoder circuit 42 in FIG. 2. In this regard, the memory system 106 includes a plurality of memory banks 108(0)-108(N). Each of these memory banks 108 is organized into a grouping of memory cells (not shown) that are operated in a higher voltage level domain. To control the operation of the memory system 106, the memory system 106 receives external system signals 109 in the lower voltage level domain. The system signals 109 may include a system clock 110 (which may be the clock signal 54 used by the pulse latch 48 shown in FIG. 2), a read/write indication 112, a memory address 114, and an external reset 116. As a non-limiting example, the external reset 116 may be a system reset where the memory system 106 resets the memory banks 108 in response to the external reset 116. The read/write indication 112 indicates whether the memory specified by the memory address 114 should be read or written. The memory system 106 may use the system clock 110 to clock the beginning and/or ending of a memory operation and/or to provide timing for the internal operations of the components of the memory system 106 either directly or indirectly.

With continuing reference to FIG. 5, a global bank controller (GBC) 118 of the memory system 106 may receive the system signal 109 for the memory system 106. The GBC 118 receives the system signals 109 and uses the system signals 109 to control the memory banks 108(0)-108(N) of the memory system 106. However, the memory cells of the memory banks 108 are operated in the higher voltage domain. Therefore, the GBC 118 provides the memory address 114 to the memory pre-decoder circuit 42. Embodiments of the memory pre-decoder circuit 42 may include a plurality of pre-decoders (like the memory pre-decoder 44 shown in FIG. 2) and pulse latches (like the pulse latch 48 shown in FIG. 2) for processing different portions of the memory address 114. The pre-decoded memory address output(s) 56 from the memory pre-decoder circuit 42, shown in FIG. 2, may be received by a decoder 122. As discussed above, the pre-decoded memory address output(s) 56 are provided in the higher voltage domain by the memory pre-decoder circuit 42. The decoder 122 is configured to select memory cells within the memory banks 108(0)-108(N) based on the pre-decoded memory address output(s) 56 from the memory pre-decoder circuit 42. In the example shown in FIG. 5, the decoder 122 has selected a row 124 of memory cells within the memory bank 108(N). The memory system 106 also includes a replica circuit 126 configured to operate with the memory pre-decoder circuit 42. The replica circuit 126 may mimic the pulse latch(es) 48 (shown in FIG. 3) to generate the reset signal(s) 74.

To communicate data bits to and from devices external to the memory system 106, the memory system 106 also includes a global input/output circuit (GIO) 128. The GIO 128 receives write data 129 from external devices and provides a data output 130 to external devices. For instance, if the read/write indication 112 indicates that the selected row 124 should be written, the data received on the external write data 129 is written to the memory cells indicated by the memory address 114. So that the write data 129 can be stored in the memory cells of the memory banks 108, the memory system 106 may include a voltage level shifter (VLS) 132. The VLS 132 shifts the write data 129 from the lower voltage domain to the higher voltage domain. Conversely, if the read/write indication 112 indicates that the accessed memory cells should be read, the data from the selected row 124 is obtained. In this case, the VLS 132 shifts the data from the higher voltage domain to the lower voltage domain. In this manner, the data output 130 is provided by the GIO 128 in the lower voltage domain.

Embodiments of the memory pre-decoder circuits and memory systems disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
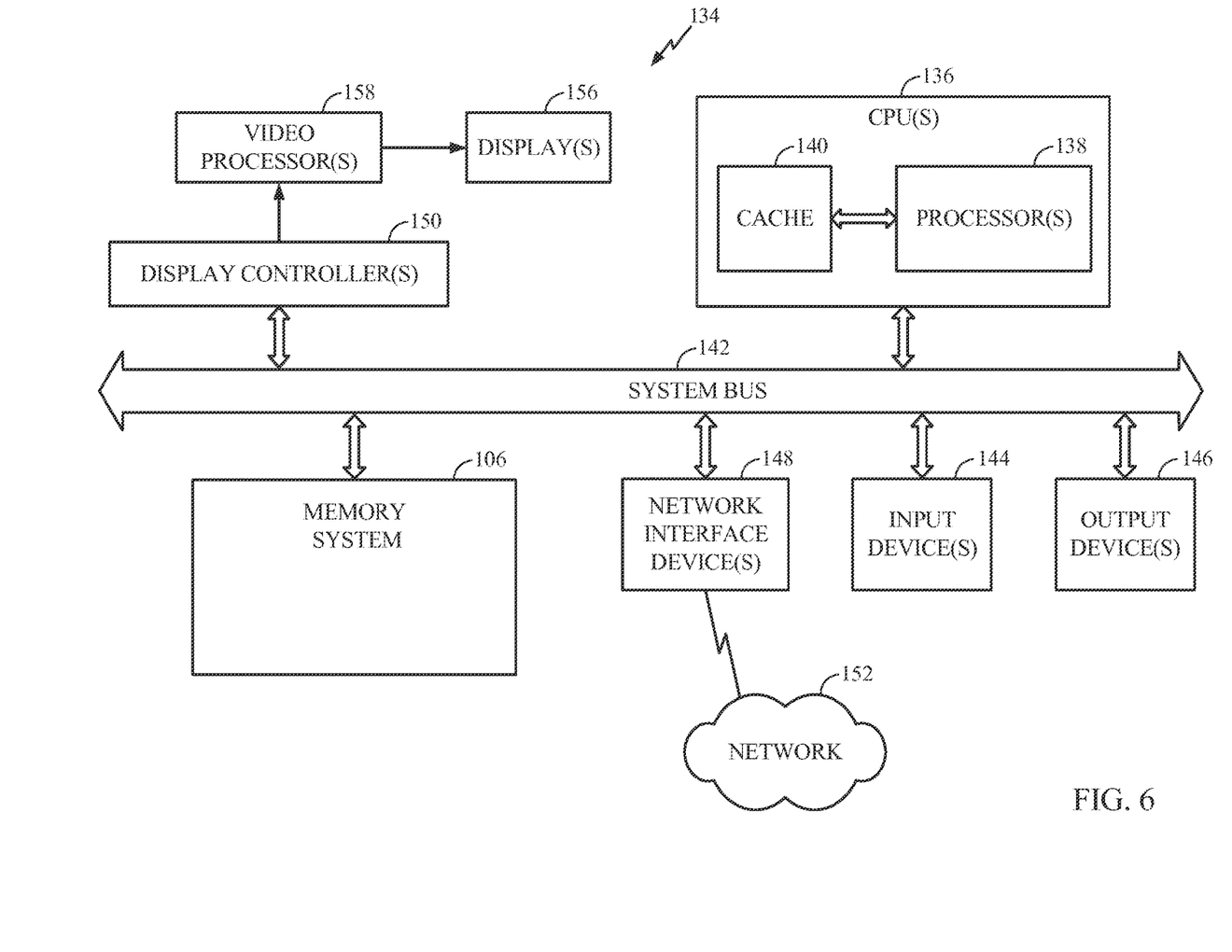
FIG. 6 is a block diagram of an exemplary processor-based system having the memory system shown in FIG. 5, which includes the memory pre-decoder circuit in FIG. 2.

In this regard, FIG. 6 illustrates an example of a processor-based system 134 that can employ the memory system 106 illustrated in FIG. 5. In this example, the processor-based system 134 includes one or more central processing units (CPUs) 136, each including one or more processors 138. The CPU(s) 136 may have cache memory 140 coupled to the processor(s) 138 for rapid access to temporarily stored data. The CPU(s) 136 is coupled to a system bus 142 and can intercouple master devices and slave devices included in the processor-based system 134. As is well known, the CPU(s) 136 communicates with these other devices by exchanging address, control, and data information over the system bus 142. For example, the CPU(s) 136 can communicate bus transaction requests to the memory system 106 as an example. Although not illustrated in FIG. 6, multiple system buses 142 could be provided, wherein each system bus 142 constitutes a different fabric.

Other master and slave devices can be connected to the system bus 142. As illustrated in FIG. 6, these devices can include the memory system 106, one or more input devices 144, one or more output devices 146, one or more network interface devices 148, and one or more display controllers 150, as examples. The input device(s) 144 can include any type of input device, including but not limited to input keys, switches, voice processors, etc. The output device(s) 146 can include any type of output device, including but not limited to audio, video, other visual indicators, etc. The network interface device(s) 148 can be any device configured to allow exchange of data to and from a network 152. The network 152 can be any type of network, including but not limited to a wired or wireless network, a private or public network, a local area network (LAN), a wide local area network (WLAN), and the Internet. The network interface device(s) 148 can be configured to support any type of communication protocol desired. The memory system 106 can include one or more memory cells to store bits of information. The memory cells are configured to be selected based on the pre-decoded memory address output(s) 56 (shown in FIG. 3) from the memory pre-decoder circuit 42 (shown in FIG. 5). In particular, the pre-decoded memory address output(s) 56 are received by the decoder 122 (shown in FIG. 5). The decoder 122 selects the appropriate memory cells in response to the pre-decoded memory address output(s) 56 from the memory pre-decoder circuit 42.

The CPU(s) 136 may also be configured to access the display controller(s) 150 over the system bus 142 to control information sent to one or more displays 156. The CPU(s) 136 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Those of skill in the art will further appreciate the various illustrative logical blocks, modules, circuits, and algorithms described in connection with the embodiments disclosed herein. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The memory systems and memory pre-decoder circuits described in connection with the embodiments disclosed herein may be operably associated with a processor, a DSP, an Application Specific Integrated Circuit (ASIC), an FPGA or other programmable logic device, discrete gate or transistor logic, discrete hardware components, or any combination thereof. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be and/or may reside in Random Access Memory (RAM), flash memory, Read Only Memory (ROM), Electrically Programmable ROM (EPROM), Electrically Erasable Programmable ROM (EEPROM), and registers, a hard disk, a removable disk, or any other form of computer-readable medium known in the art.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory pre-decoder circuit for reducing memory access setup times, comprising:
   a memory pre-decoder disposed within a memory pre-decode setup path, wherein the memory pre-decoder is configured to pre-decode a memory address input to generate a pre-decoded memory address input; and
   a pulse latch disposed outside of the memory pre-decode setup path, wherein the pulse latch is configured to:
      sample the pre-decoded memory address input based on a clock signal; and
      generate a pre-decoded memory address output.

2. The memory pre-decoder circuit of claim 1, wherein the pulse latch is configured to receive the pre-decoded memory address input comprising a pre-decoded input of a pre-decoded memory address.

3. The memory pre-decoder circuit of claim 1, wherein the pulse latch is configured to generate the pre-decoded memory address output comprising a pre-decoded output of a pre-decoded memory address.

4. The memory pre-decoder circuit of claim 1, wherein the pulse latch is configured to generate the pre-decoded memory address output within two gates of the clock signal.

5. The memory pre-decoder circuit of claim 1, wherein the memory pre-decoder comprises an address pre-decode logic circuit configured to:
   receive the memory address input as a plurality of address line inputs;
   pre-decode the plurality of address line inputs; and
   generate an intermediary pre-decoded address signal from the pre-decode of the plurality of address line inputs.

6. The memory pre-decoder circuit of claim 5, wherein the memory pre-decoder further comprises a reset circuit configured to:
receive the intermediary pre-decoded address signal and a reset signal;
generate the pre-decoded memory address input in accordance with the intermediary pre-decoded address signal when the reset signal is in a non-reset signal state; and
reset the pre-decoded memory address input when the reset signal is in a reset signal state.

7. The memory pre-decoder circuit of claim 1, wherein the memory pre-decoder is configured to pre-decode the memory address input in a lower voltage domain to generate the pre-decoded memory address input in the lower voltage domain.

8. The memory pre-decoder circuit of claim 1, wherein the pulse latch is configured to sample the pre-decoded memory address input in a lower voltage domain and generate the pre-decoded memory address output in a higher voltage domain.

9. The memory pre-decoder circuit of claim 1, wherein:
the memory pre-decoder is configured to generate the pre-decoded memory address input in a lower voltage domain; and
the pulse latch is configured to generate the pre-decoded memory address output in a higher voltage domain.

10. The memory pre-decoder circuit of claim 1, wherein:
the memory pre-decoder is further configured to pre-decode the memory address input in a lower voltage domain to generate the pre-decoded memory address input in the lower voltage domain; and
the pulse latch is further configured to sample the pre-decoded memory address input in the lower voltage domain and generate the pre-decoded memory address output in a higher voltage domain.

11. The memory pre-decoder circuit of claim 1, wherein:
the pulse latch further comprises a storage node; and
the pulse latch is configured to sample the pre-decoded memory address input by passing the pre-decoded memory address input to the storage node as a preliminary pre-decoded memory address output once the clock signal becomes active.

12. The memory pre-decoder circuit of claim 11, wherein the pulse latch is configured to sample the pre-decoded memory address input by passing the pre-decoded memory address input in a lower voltage domain to the storage node as the preliminary pre-decoded memory address output in a high voltage domain.

13. The memory pre-decoder circuit of claim 12, wherein the pulse latch is configured to generate the pre-decoded memory address output in the higher voltage domain based on the preliminary pre-decoded memory address output from the storage node.

14. The memory pre-decoder circuit of claim 11, wherein the pulse latch is further configured to hold the pre-decoded memory address output when the clock signal is inactive.

15. The memory pre-decoder circuit of claim 11, wherein the memory pre-decoder is further configured to receive a reset signal and close the storage node of the pulse latch when the reset signal is in a reset signal state.

16. The memory pre-decoder circuit of claim 1 integrated into a semiconductor die.

17. The memory pre-decoder circuit of claim 1 included in a device selected from a group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

18. A memory pre-decoder circuit, comprising:
means for pre-decoding a memory address input within a memory pre-decode setup path to generate a pre-decoded memory address input;
means for sampling the pre-decoded memory address input outside of the memory pre-decode setup path based on a clock signal; and
means for generating a pre-decoded memory address output outside of the memory pre-decode setup path.

19. A method of pre-decoding a memory address input for a memory system, comprising:
pre-decoding the memory address input within a memory pre-decode setup path to generate a pre-decoded memory address input;
sampling the pre-decoded memory address input using a pulse latch outside of the memory pre-decode setup path based on a clock signal; and
generating a pre-decoded memory address output using the pulse latch outside of the memory pre-decode setup path.

20. The method of claim 19, wherein generating the pre-decoded memory address output using the pulse latch comprises generating the pre-decoded memory address output comprising a pre-decoded output of a pre-decoded memory address.

21. The method of claim 19, wherein pre-decoding the memory address input comprises:
receiving the memory address input as a plurality of address line inputs;
pre-decoding the plurality of address line inputs; and
generating an intermediary pre-decoded address signal from the pre-decoding of the plurality of address line inputs.

22. The method of claim 19, wherein pre-decoding the memory address input further comprises:
receiving a reset signal;
generating the pre-decoded memory address input in accordance with the intermediary pre-decoded address signal when the reset signal is in a non-reset signal state; and
resetting the pre-decoded memory address input when the reset signal is in a reset signal state.

23. The method of claim 19, wherein:
pre-decoding the memory address input within the memory pre-decode setup path to generate the pre-decoded memory address input comprises pre-decoding the memory address input in a lower voltage domain to generate the pre-decoded memory address input in the lower voltage domain;
sampling the pre-decoded memory address input using the pulse latch outside of the memory pre-decode setup path based on the clock signal comprises sampling the pre-decoded memory address input in the lower voltage domain based on the clock signal; and
generating the pre-decoded memory address output using the pulse latch comprises generating the pre-decoded memory address output in the higher voltage domain.

24. The method of claim 19, further comprising:
providing a storage node; and
wherein sampling the pre-decoded memory address input using the pulse latch comprises passing the pre-decoded memory address input to the storage node as a preliminary pre-decoded memory address output when the clock signal is active.

25. The method of claim 24, wherein generating the pre-decoded memory address output using the pulse latch comprises generating the pre-decoded memory address output based on the preliminary pre-decoded memory address output from the storage node.

26. A memory system, comprising:
  a memory pre-decoder circuit, comprising:
    a memory pre-decoder disposed within a memory pre-decode setup path, wherein the memory pre-decoder is configured to pre-decode a memory address input to generate a pre-decoded memory address input;
    a pulse latch configured to:
      sample the pre-decoded memory address input based on a clock signal;
      generate a pre-decoded memory address output; and
  memory cells configured to be selected based on the pre-decoded memory address output.

* * * * *